United States Patent [19]

Archey et al.

[11] 3,999,105
[45] Dec. 21, 1976

[54] LIQUID ENCAPSULATED INTEGRATED CIRCUIT PACKAGE

[75] Inventors: William Bogan Archey, Shelburne; Ronald Dominic Audi, Burlington; Roger James Clark, Underhill; Robert James Redmond, Essex Junction, all of Vt.

[73] Assignee: International Business Machines Corporation, Armonk, N.Y.

[22] Filed: Apr. 19, 1974

[21] Appl. No.: 462,462

[52] U.S. Cl. .................. 317/100; 317/101 D; 339/17 CF; 174/16 HS
[51] Int. Cl.² ...................................... H05K 7/20
[58] Field of Search ............. 165/105; 339/17 CF, 339/17 LM, 17 M, 112 R, 194 R, 277 R; 174/15 R, 16 R, DIG. 3, DIG. 5, 68.5, 138 R, 138 E; 357/75, 76, 81, 82; 317/100, 101 CM, 101 D, 101 CC, 101 CP

[56] References Cited

UNITED STATES PATENTS

| | | | |
|---|---|---|---|
| 2,205,502 | 6/1940 | Tromp | 339/194 R |
| 2,978,612 | 4/1961 | Lutton | 317/101 D |
| 3,316,458 | 4/1967 | Jenny | 317/101 CP |
| 3,340,491 | 9/1967 | Deakin | 339/194 R |
| 3,411,049 | 11/1968 | Trincossi | 357/82 |
| 3,417,814 | 12/1968 | Oktay | 174/15 R |
| 3,487,350 | 12/1969 | Hammell | 339/17 C |
| 3,495,131 | 2/1970 | Melcher | 339/17 CF |
| 3,634,879 | 1/1972 | Longenecker | 339/17 CF |
| 3,686,533 | 8/1972 | Garnier | 174/DIG. 3 |
| 3,741,292 | 6/1973 | Aakalu | 317/100 |
| 3,764,856 | 10/1973 | Martin | 174/DIG. 5 |
| 3,774,078 | 11/1973 | Martin | 174/DIG. 5 |
| 3,823,771 | 7/1974 | Ludwig | 357/82 |
| 3,851,221 | 11/1974 | Beaulieu | 317/101 CC |

*Primary Examiner*—Gerald P. Tolin
*Attorney, Agent, or Firm*—Francis J. Thornton

[57] ABSTRACT

A liquid encapsulated high density integrated circuit package which serves as a complete computer basic system module having both logic and memory circuits in the same package. This unit takes advantage of improvements in the integrated circuit art to minimize the number of physical units required to provide the desired memory capacity while simultaneously maximizing density and thereby minimizing signal path length. Basically the package contains a plurality of stacked semiconductor wafers each of which provides either integrated memory or logic functions. Each semiconductor wafer is mounted on an insulated wafer carrier and is connected to stacking pins around the perimeter of the carrier via a series of radial interconnection which are flexible expansion leads disposed around the outer edge of the wafer. Each wafer is floatation mounted by attaching only its center to the carrier to minimize the stress effects of a thermal expansion mismatch between the wafer, the carrier, and the radial interconnections.

The carrier on which the wafer is mounted is constructed to mechanically secure and support the wafer at its physical center, to provide electrical contact to the wafer substrate, to provide support of electrical stacking pins which connect with stacking pins on adjacent carriers, to provide support for the radial interconnection expansion leads extending between pads on the wafer and the stacking pins and to minimize the effects of thermal mismatch in the structure.

A finned housing encloses the stacked wafers and carriers and is hermetically sealed to a header having feed through termination pin such that the package can contain a liquid coolant which aids in the transfer of heat between the wafers and the finned housing thus maximizing the dissipation of heat from the wafers.

25 Claims, 6 Drawing Figures

LIQUID ENCAPSULATED INTEGRATED CIRCUIT PACKAGE

BACKGROUND OF THE INVENTION

1. Field of the Invention

This invention relates generally to packaging and more particularly to packaging of semiconductor slices or wafers.

2. Description of the Prior Art

In the semiconductor art, numbers of complex circuits are formed in slices or wafers of semiconductor materials. These wafers are then broken or diced into individual circuits or chips which are subsequently packaged. Such packaging of individual chips is well known and has been well eveloped. Packages suitable for containing a large quantity of integrated circuit chips are known to the art and diclosed for example in U.S. Pat. No. 3,529,213 to W. A. Farrand, et al. Another example of the packaging structure providing for a multiplicity of hermetically sealed modules for integrated circuit chips and incorporating cooling is disclosed in U.S. Pat. No. 3,706,010 to L. Laermer et al.

The use of liquid cooling for dissipating heat generated by the operation of the integrated circuit chips is disclosed in the commonly assigned U.S. Pat. No. 3,537,063 to P. E. Beaulieu.

While the density of semiconductor circuits has greatly increased over the past years, the packaging of these integrated circuits has failed to keep up with the increase of circuit density, for while packaging of individual chips containing such circuits has been well developed little or no attention has been given to packages which maximize the density of the packaging of such semiconductor circuits.

Alternative approaches to the same problems are described in a patent application, Ser. No. 462,461, by A. A. Rifkin et al entitled "An Electronic Assembly for Wafer Circuit Elements" and a patent application, Ser. No. 462,463, by D. W. Skinner entitled "A Wafer Circuit Package" both assigned to the assignee of this application and filed on even date herewith.

SUMMARY OF THE INVENTION

Accordingly it is an object of the present invention to provide a package which will incorporate an entire semiconductor wafer containing large numbers of integrated circuits without dicing the wafer into the individual circuits.

It is the further object of the invention to provide a package for an integrated circuit in which the transfer of heat from the wafer to the exterior of the package is significantly improved.

It is yet another object of the invention to provide a semiconductor wafer package constructed to minimize the thermal expansion mismatch stresses between the semiconductor wafer and the carrier for the wafer; which carrier also supports the necessary electrical interconnections between the wafer and the package exterior.

It is still another object of the invention to provide a package which is easily constructed and which can be electrically tested at each level of the construction.

It is still a further object of the invention to provide a semiconductor package which incorporates semiconductor memory wafers together with the necessary logic functions to provide a complete computer basic system module.

It is yet a further object of the invention to provide a basic system module in which the density is maximized and the signal path length is minimized.

It is another object of the invention to provide a package which can be easily scaled up or down to provide greater or lesser capacity without losing any of the benefits of the package.

These and other objects feature improvements of the present invention are accomplished in part by mounting a semiconductor wafer having integrated circuits formed therein onto an insulating wafer carried having a boss in the center thereof. The wafer has only a small central portion bonded to the central boss of the carrier and the remainder of the wafer is in suspension from the boss so that all of the wafer from the bonded central portion to the edge has radial freedom of movement. This radial freedom of movement prevents adverse effects, caused by the thermal heating of the wafer during electrical operation of the integrated circuits in the wafer, from effecting the characteristics of the circuits in the wafer while permitting the use of an entire wafer in an encapsulated package which provides suitable heat dissipation and minimizes signal path length.

DESCRIPTION OF THE DRAWINGS

These and other features of the present invention will be more fully understood from the accompanying drawings in which.

Figure 1:
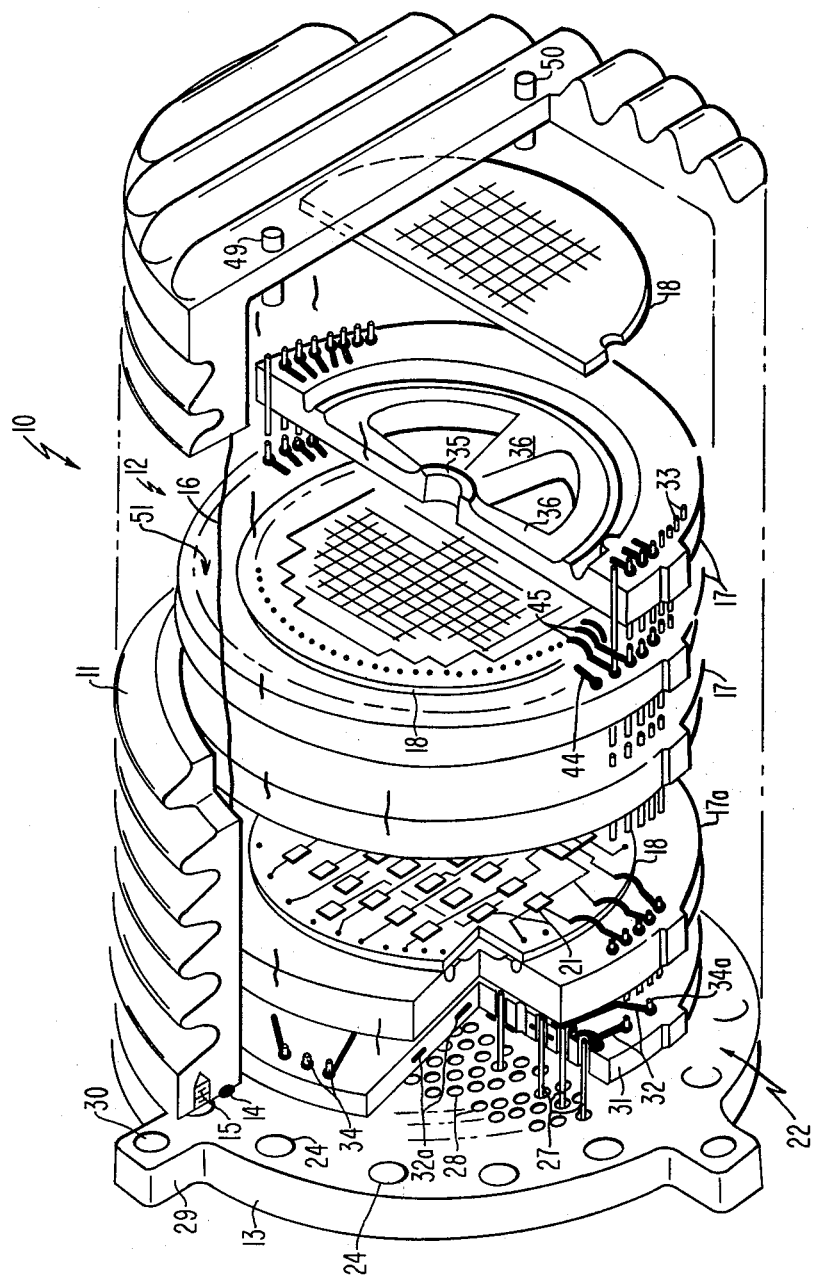
FIG. 1 is a partially exploded and partially sectional view of a package built in accordance with the invention.

The package 10 is formed of a finned housing 11 which is hermetically sealed by a gasket 14 and bolts 15 to a base plate 13. The package is partially filled with a liquid coolant 16 such as a fluorinated hydrocarbon which has a suitable dielectric value. Within the housing 11 there is arranged a stack 12 of insulating wafer carriers 17 each of which carries a semiconductor wafer 18 having either integrated circuits therein or having individual silicon chips 21 thereon. Between the end wafer carrier 17a and the base plate 13 is disposed a distribution card 22. The package 10 is, as shown, operated in a horizontal position.

Figure 3:
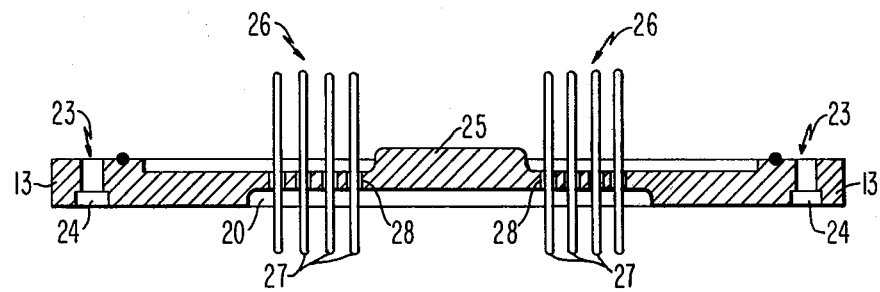
FIG. 3 is a detailed cross-sectional view of the base plate of FIG. 1.

The base plate 13 is shown enlarged and in cross-section in FIG. 3 and is comprised essentially of three distinct portions, a thick outer ring 23 having a series of bolt holes 24 there through, a solid central pedestal 25 extending up above the level of the outer ring 23 and an intermediate region 6 the surface of which is depressed below that of the pedestal 25 and the outer ring 23. Opposite the region 26 and the pedestal 25 is a cavity 20. Four evenly spaced ears 29 also pierced with bolt holes 30, are provided around the outside of the base plate. These ears are used to mount the entire package to a suitable receptacle (not shown). In the region 26 there is a series of feed through termination pins 27 adapted for connection to exernal circuit means (not shown). These pins 27 pass through and are held in the base plate by suitable hermetic glass seals 28 which also insulate the pins from the base plate 13.

Disposed immediately above the base plate 13 is the distribution card 22 which is arranged to splay the conduction of electrical signals from the termination pins 27 outwardly to a series of concentric nail head stacking pins 34 disposed around the periphery of the distribution card 22. Preferably the distribution card 22 is composed of a suitable insulating material 31 such as ceramic or an organic material such as a polymide compatable with the coolant 16 and has on each surface thereof suitable conductive leads 32 for connecting the selected termination pins to selected stacking pins adapted to conduct signals to the wafer carriers 17.

The distribution card 22 is formed for example, by obtaining a sheet of insulating material 31 clad with metal layers on either side thereof and then forming the conductive leads in the metal layers by using standad printed circuits forming techniques. Holes then drilled in the card where ever stacking pins 34 or termination pins 27 are to be located. These holes are then plated through with a suitable conductive material using known techniques. The stacking pins 34 are then inserted into their respective plated through holes and bonded thereto by suitable techniques such as soldering. The distribution card 22 is placed onto the base plate 13 so that each termination pin 27 in the base plate extends through a plated through hole. The distribution card is firmly seated against the pedestal 25. The pedestal 25 not only provides mechanical support for the distribution card 22 but further provides a reference plane for the future stacking of the wafer carriers 17 when they are placed on top of the distribution card. When the distribution card has been firmly seated against the pedestal 25, the termination leads 27 are soldered into their respective holes in the distribution card so that they will make contact with one or more respective conductive leads 32. In this way an electrical path is provided across the distribution board from each termination pin 27 via one or more of the conductive leads 32 to one or more of the stacking pins 34 arranged around the periphery of the distribution card.

Although FIG. 1 illustrates but a single row of stacking pins 34 around the periphery of the distribution card 22, as many as seven hundred and fifty stacking pins have been provided in five concentric rows. The distribution card 2 can be provided with internal leads 32, as shown in FIG. 1, if such internal leads are needed or desired. Techniques for forming such multi-layered structures are known to the art. Each stacking pin 34 on the distribution card must extend above the upper surface of the distribution card and be provided with a male end 34a adapted to mate with the female end 33b of stacking pins 33 passing through each of the wafer carriers 17.

Figure 2:
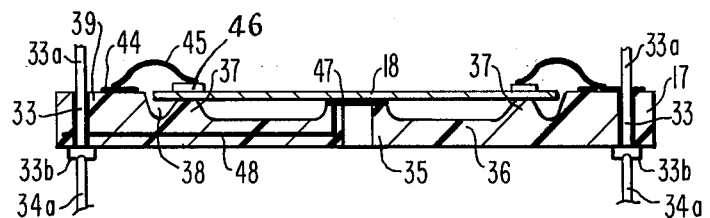
FIG. 2 is a detailed sectional view of the wafer carrier used in FIG. 1.

The wafer carrier 17 is shown enlarged and in section in FIG. 2 and is designed mechanically to support a silicon wafer 18 and to provide electrical contacts to the supported wafer from a series of stacking pins 33 on the periphery thereof. This wafer carrier 17 is also formed of a suitable insulating material, such as ceramic or an organic material such as polyimide, which is compatable with the liquid coolant 16 encapsulated within the housing. Preferably this wafer carrier 17 is made in the shape of a spoked wheel. The carrier 17 has a central hub 35 in the form of a boss or pedestal on the upper most surface of the carrier, and a plurality of spokes 36 extending from the bottom of the hub 35 to a raised annulet 37 forming an inner ring concentric with the hub 35. Both the hub 35 and the annulet 37 are thicker than the spokes 36. Beyond the annulet 37 is a circular trench 38 which demarcates the annulet 37 from a circumferential rim 39 forming an outer ring concentric with the annulet 37 and the hub 35. The wafer 18 is secured at its center to the hub 35 by any suitable means. For example, when the hub 35 has a conductive coating thereon the wafer is soldered or otherwise bonded thereto. The wafer 18 extends across the spokes 36 to rest on the annulet 37. As shown in FIG. 2 the rim 39 preferably is made thicker than the hub 35 and the annulet 37 so that its upper surface is on the same plane as the upper surface of the wafer 18. Disposed in the rim 39 is a series of plated through holes 40 in which the stacking pins 33 are secured by a suitable bonding material such as solder 42. The stacking pins 33 are provided at the lower end thereof with a female end 33b into which the male end 34a of the stacking pin 33 may be inserted and secured. These pins can be secured to one another by a suitable technique such as soldering that will provide good electrical connections and mechanical support for the next adjacent carrier in the stack.

A series of radially directed conductive lands 44 are disposed on the upper surface of the rim 39 of each wafer carrier 17 as to be directed from the stacking pins to which they are affixed inwardly toward the hub 35. Connected to each of these lands 44 are a series of formed interconnection expansion leads 45 which are mechanically attached to the lands 44 to provide suitable electrical interconnections to pads 46 provided on the periphery of the wafer 18. These pads 46 are suitably connected to th circuits on the wafer. As shown in FIG. 2, the pads 46 on each of the wafers 18 is arranged to be over the annulet 37. Thus when wafer 18 is fastened to the substrate in the region of the hub 35, by a suitable means such as a solder bond 47, and to the expansion leads 45, strains to the wafer 18 in a vertical direction, that may occur by bonding of the leads 45 to the wafer are minimized.

As indicated in FIG. 2, there is provided internally an interconnection lead 48 which extends from the solder bond 47 to one of the stacking pins. This lead 48 provides a means for applying a suitable electrical potential to the wafer 18. It should be noted that the wafer 18, however, is not fastened to the annulet 37 but only bolstered by it. In this way the wafer 18 is permitted to expand radially from the hub 35. This radial freedom prevents undue mechanical, thermal, or electrical stresses on the wafer when the system is operated.

Once the wafer has been bonded at hub 35 to the carrier and lead 48 and the preformed expansion leads bonded to both the wafer bonding pads 46 and the radially directed lands 44 the assembly is electrically tested to assure that each of the connections to each of the pads through the stacking pins are complete and functional. When the electrical tests of the wafer mounted on the carrier are satisfactory, the carrier is then disposed over the distribution card such that the male ends 34a of each of the stacking pins 34 on the distribution card penetrate the female end 33b of the stacking pins 33 on the carrier 17. Once proper alignment is made, the stacking pins 33 and 34 are soldered or otherwise satisfactorily electrically and mechanically bonded together. Additional wafer carriers 17 carrying other wafers 18 may now be stacked one above the other in a similar fashion until the proper height or proper function of the desired basic system module is achieved. As each additional wafer carrier is applied to the stack testing of the entire stack can be provided to assure that each added wafer carrier is provided with suitable electrical connections.

It should be obvious, of course, that all stacking pins may not be connected in any particular wafer carrier via a lead 38 to the wafer 18 on the carrier since certain of the stacking pins serve only as a conduit for providing signals to an adjacent level.

Once all the desired electrical functions in the stack have been achieved, the stack is ready to be encapsulated. This is accomplished by placing the O-ring 14 in a suitable groove provided in the housing 11 and/or the base plate 13 and bolting the housing 11 onto the base plate 13 to provide a hermetic seal. The entire assembly is now filled through a fill port 49 on the housing with a suitable cooling liquid such as a fluorinated hydrocarbon. For purposes of safety a pressure relief port 50 may also be connected to the housing.

Alternately the fill pot 49 can be made to incorporate the pressure relief valve. As shown in FIG. 1 a sufficient quantity of liquid coolant is introduced to cover all of the wafers 18 in the stack, when the stack is operated in a horizonal position. It is desirable, however, to leave a small air space 51 above the liquid coolant 16 to allow for gas compression from increased temperatures during package operation.

Immersion of the wafers 18 in the liquid coolant prevents the wafers from becoming hot enough, during electrical operation of the system, to damage the electrical circuits on the wafers. Additionally the openings in the wafer carrier 17 between the spokes 36 permits the liquid cooling to wash against the backside of the wafer to further aid in cooling the wafer.

In operation the liquid coolant 16 removes heat from the wafers 18 by nucleate boiling and recondensation. Vapors from the boiling liquid coolant rises from the coolant and condenses on the wall of the housing 11 in the airspace 51. Because of the nucleate boiling of the coolant 16 convection paths are set up in the coolant which causes the coolant to continually pass across the surface of each of the wafers 18 and to further reduce the temperatures created in the wafers 18 by the electrical operation of the system. Through the circulation of the liquid coolant across the face of the wafers and the evaporation and condensation of the vapors in the air space as explained above, large quantities of heat are removed from the wafers 18 to the finned housing 11 surrounding the stack. Heat transfer is accomplished through condensation of the vapor and through conduction to the housing in contact with the liquid and the vapors. The heat so transferred will move through the walls of the container to the exterior fins which then radiate the heat to the surrounding ambient. If desired cooling air can be forced over the exterior surface of the housing to further assist in this cooling.

Figure 4:
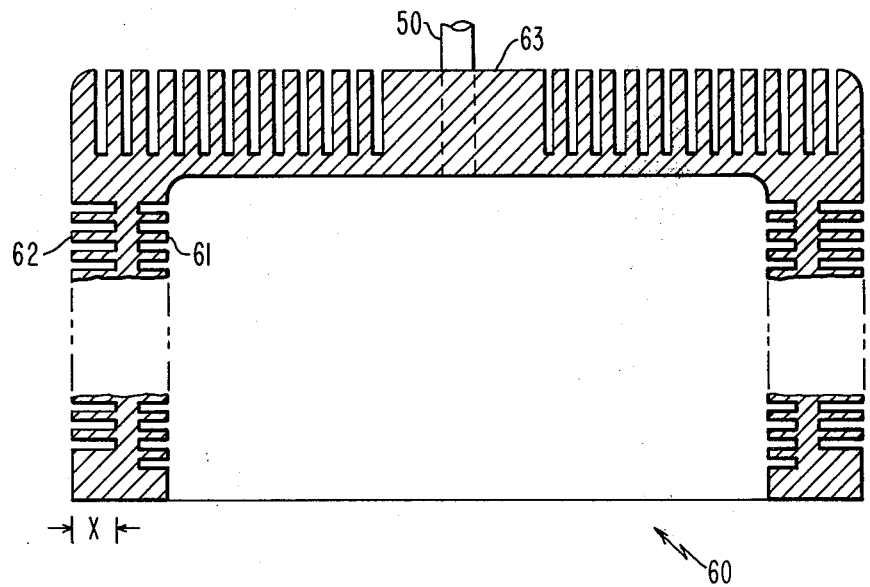
FIG. 4 illustrates in cross-section an alternate embodiment of the housing of FIG. 1.

Turning now to FIG. 4 there is illustrated an embodiment of the housing 11 which has both interior and exterior cooling fins. This double finned housing 60 would be used to replace the housing 11 shown in FIG. 1. This housing 60 has a series of internal fins 61 and a series of external fins 62. The internal fins 61 substantially aid in the heat exchange between the liquid and or vapor contained within the housing 60 and the exterior fins 62 outside the container by considerably increasing the convection flow of fluid within the housing as well as providing a significantly larger internal surface for contact with the fluid. It has been found that the length X of the external fins should be approximately one third greater than the length of the internal fins for best and more efficient transfer. It is to be noted that the top of the housing 60 is provided with a large fin 63 which has therein both the fill port and the relief port.

By following the teachings of this invention a complete basic memory module can be constructed in a small compact very dense package.

Figure 5:
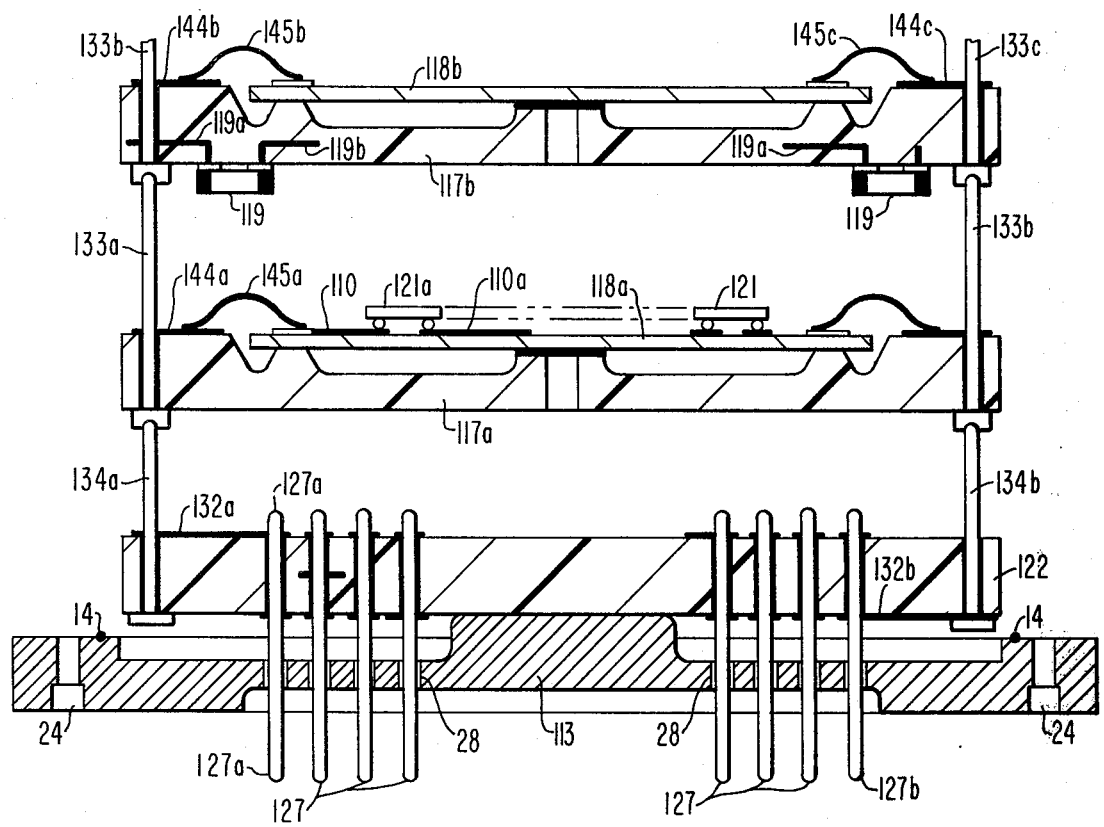
FIG. 5 illustrates an electrical path of the signal when the invention is operated.

As shown in simplified form in FIG. 5 the base plate 113 having termination pins 127 has mounted thereon a distribution card 122. Thus one of the termination pins indicated as pin 127a has a lead 132a extending from it on the surface of the card to a stacking pin 134a. This stacking pin is in turn connected to a stacking pin 133a bonded to a first wafer carrier 117a. This wafer carrier 117a supports a silicon wafer 118a which would be provided with a plurality of silicon chips thereon, one of which is shown as chip 121a. Preferably these chips contain logic circuits which are placed on the bottom of the stack closer to the distribution card since these logic circuits tend to be less regular in their configuration and less dense. Also these logic circuits tend to be considerably faster in operation than the memory circuits which are disposed on the upper most wafer carriers. Typically the speed difference between memory and logic circuits is one or more in magnitude. Thus the shorter circuit paths between the termination pins and the logic circuits on the first wafer is of advantage in avoiding delays caused by the longer electrical paths if such logic circuits were provided further up the stack. These logic circuit chips are connected by leads to selected stacking pins. As shown chip 121a has a lead 110 extending from it to an expansion lead 145a to radial land 144a to stacking pin 133a. A return lead 110a goes from the chip to another stacking pin (not shown).

Stacking pin 133a is in turn connected to another stacking pin 133b which is connected to a wafer 118b through a radial land 144b and an expansion lead 415b. Wafer 118b contains a large number of memory circuits plus associated decode circuitry. Such wafers can provide many thousands of bits of memory information. While such memory information is extremely dense in such integrated circuit carrying wafers, the nature of the circuits provided in the wafers and their related support circuits are such that they require a relatively small number of input or output connections from the wafer to the wafer carrier. Thus for the state-of-the-art density obtainable in such memory wafers approximately 600 stacking pins and lead connections are required around the edge of each of these memory wafers. If we assume that pin 127a is a power pin i.e. supplies electrical power to each level then it is desired that decoupling capacitors be connected to it. These decoupling capacitors are shown as 119 and are located on the underside of the wafer carriers 117b which carry the memory wafers 118b. These decoupling capacitors are connected by internal leads 119a to the stacking pin 133b and by leads 119b to a return. Opposite wafer 118b is also provided an additional expansion lead 145c, radial land 144c, and a stacking pin 133c. This stacking pin is again connected through a lower stacking pin 133b and 134b to a lead 132b located on the underside of distribution card 122 and connected to another termination pin 127b so that information can be selected from the memory and return through the stacking pins to a suitable output pin 127b.

Figure 6:
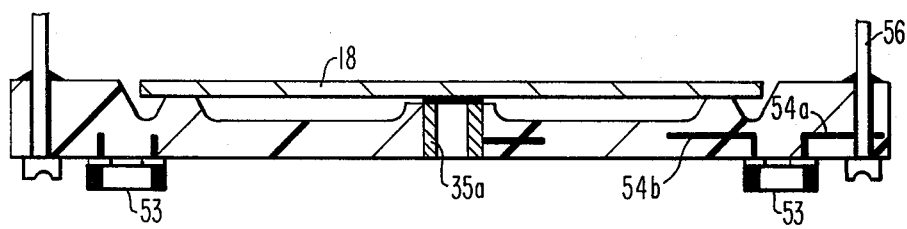
FIG. 6 is a detailed cross-sectional view of an alternate wafer carrier, Description of the preferred embodiment referring now to the drawings and more particularly to FIG. 1 the features of an integrated circuit package 10 in accordance with the invention are shown. It should be understood that to avoid confusion many details of the package are not shown in this view.

FIG. 6 illustrates in detail the construction of a wafer carrier comprised of organic material such as a polimide. This wafer carrier is identical to that shown in FIG. 2 except that an internal metallic sleeve 35a has been provided within the center of the hub 35 to provide both structural rigidity to the unit and to assure that a suitable electrical connection and bond can be made between the wafer 18 which was provided thereon and the hub 35. Also shown in this figure are decoupling capacitors 53 which are connected to suitable internal leads 54a and 54b to various stacking pins such as pin 56.

It should be understood from the above description and the accompanying drawings that the present invention provides a greatly improved compact dense basic memory module which provides for adequate cooling, ease of assembly, and rework while minimizing thermal mismatch and avoiding undue radial strains in the wafers utilized in the package. Some of the features disclosed herein are; a high degree of integration contained within the package in which both logic and memory are contained in the same package to provide a high integrated electronic unit, a means whereby each component level of the package will act as a means to conveniently handle and test full memory wafers, a means whereby the stack may be expanded with minimal tooling impact, a means of utilizing maximum geometric efficiency with minimum and equal electrical paths therein with minimum heat generation and maximum heat dissipation, a means of cooling the semiconductor wafer on both sides, and a configuration which is more adaptable to both air and water cooling while providing flow direction of coolant contained therein.

While the invention has been particularly shown and described with reference to a preferred embodiment thereof, it will be understood by those skilled in the art that various changes in forms and in detail may be made therein without departing from the spirit and scope of the invention.

What is claimed is:

1. An integrated circuit package comprising
a semiconductor wafer, and
a semiconductor wafer carrier comprising,
a body of insulating material,
centrally disposed means on said body fixedly holding the semiconductor wafer at its center, and
means for bolstering the periphery of the wafer held on said centrally disposed means while permitting radial freedom of movement to the wafer held on said centrally disposed means to minimize the stress effects of thermal expansion mismatch between the carrier and the wafer held thereon.

2. The package of claim 1 wherein said body further includes
a circumferential member encompassing said bolstering means,
a plurality of electrically conductive means disposed on said circumferential member and,
means providing flexible electrical contacts extending from said conductive means to said wafer held on said centrally disposed means.

3. An integrated circuit package comprising
a semiconductor wafer, and
a semiconductor wafer carrier comprising,
a body of insulating material,
centrally disposed means on said body fixedly holding the semiconductor wafer at its center, and
means for bolstering the periphery of the wafer held on said centrally disposed means while permitting radial freedom of movement to the wafer held on said centrally disposed means to minimize the stress effects of thermal expansion mismatch between the carrier and the wafer held thereon said body further includes
a circumferential member encompassing said bolstering means,
a plurality of electrically conductive means disposed on said circumferential member and,
means for providing flexible electrical contacts extending from said conductive means to said wafer held on said centrally disposed means,
said body is an organic material,
said centrally disposed means is a boss on the surface of the body containing a conductive sleeve and,
said bolstering means is a raised annulet surrounding said boss.

4. The package of claim 3 wherein
said plurality of electrically conductive means comprises a plurality of stacking pins in said circumferential member for electrically contacting and mechanically supporting additional wafer carriers and,
lands on the surface of said member connected to said pins and disposed in a radial direction, and
said means for providing electrical contacts comprises a plurality of flexible expansion leads each of which is connected to a respective land.

5. The package of claim 3 wherein
a plurality of spokes extend from said boss to support said annulet around said boss and,
a circular trench surrounds said annulet and demarcates the annulet from said circumferential member.

6. The package of claim 3 wherein there is further provided,
a plurality of decoupling capacitors disposed on said region which are coupled to one of said conductive means.

7. A packaging assembly for semiconductor integrated circuit wafers comprising,
a base plate,
a plurality of termination pins affixed to said base plate adapted for connection with external signal means,
a wafer carrier over said base plate,
a housing enclosing said wafer carrier and hermetically sealed to said base plate,
said wafer carrier having means for securing a semiconductor wafer thereon,
a semiconductor wafer having a central portion and a peripheral portion,
said semiconductor wafer having its central portion affixed to said securing means on said wafer carrier,
said peripheral portion of said wafer having radial freedom of movement to minimize the stress affects of thermal expansion mismatch of the carrier and the wafer held thereon, a plurality of stacking pins electrically coupled to said wafer arranged around the periphery of said wafer carrier, and means electrically coupling said termination pins to said wafer carrier stacking pins.

8. The assembly of claim 7 further including means for introducing cooling fluid into the housing.

9. The assembly of claim 8 wherein said means for electrically coupling said termination pins to said stacking pins comprises, a distribution card of insulating material, a plurality of nail head stacking pins arranged around the periphery of said distribution card, a plurality of conductive leads on the surface of said card connecting a respective stacking pin on said distribution card to a respective termination pin in the base plate.

10. A packaging assembly for semiconductor integrated circuit wafers comprising, a base plate, a plurality of termination pins affixed to said base plate adapted for connection with external signal means, a wafer carrier over said base plate, a housing enclosing said wafer carrier and hermetically sealed to said base plate, said wafer carrier having means for securing a semiconductor wafer thereon, a semiconductor wafer substantially affixed at its center to securing means on said wafer carrier, a plurality of stacking pins electrically coupled to said wafer arranged around the periphery of said wafer carrier and means for electrically coupling said termination pins to said wafer carrier stacking pins, means for introducing cooling fluid into the housing, said means for electrically coupling said termination pins to said stacking pins comprising, a distribution card of insulating material, a plurality of nail head stacking pins arranged around the periphery of said distribution card, a plurality of conductive leads on the surface of said card connected to respective stacking pin on sid distribution card to a respective termination pin in the base plate, and said base plate having a central pedestal and said distribution card is mounted on said pedestal.

11. The assembly of claim 10 wherein said termination pins are hermetically and insulatively sealed in said base plate.

12. The assembly of claim 8 wherein said wafer carrier comprises, a central hub, a plurality of spokes extending from said hub, an annulet supported by said spokes concentric with said hub, and, a circumferential rim containing said stacking pins encompassing the annulet and concentric therewith, said hub and said annulet being thicker than the spokes and thinner than the rim.

13. The assembly of claim 11 wherein said card contains internal conductive leads.

14. The assembly of claim 12 wherein said wafer is provided with a ring of pads, said pads on said wafer being aligned over said annulet.

15. The assembly of claim 14 wherein said rim is further provided with a series of radially directed lands each of which is connected to a respective stacking pin.

16. The assembly of claim 15 wherein said rim is further provided with a series of formed expansion leads each of which is connected between a respective pad on the wafer and a respective land.

17. The assembly of claim 16 wherein said housing is provided with a plurality of cooling fins on its exterior surface concentric with the wafer carrier.

18. The assembly of claim 17 wherein said housing is provided with a set of cooling fins on its interior surface and a set of cooling fins on its exterior surface, both sets of fins being concentric with the wafer carrier.

19. The assembly of claim 18 wherein the ratio of the length of the exterior cooling fins to the length of the interior cooling pin is three to two.

20. The assembly of claim 13 wherein said wafer carrier is formed of an organic material compatable with the cooling fluid contained in said housing.

21. The assembly of claim 20 wherein said wafer carrier is provided with a central metallic insert in the central hub contacting said semiconductor wafer.

22. The assembly of claim 21 wherein said cooling fluid is a fluorinated hydrocarbon.

23. The assembly of claim 13 wherein said wafer carrier is ceramic.

24. The assembly of claim 13 wherein said wafer carrier is polyimide.

25. The assembly of claim 15 wherein said rim is further provided with decoupling capacitors coupled to a stacking pin.

* * * * *